(12) United States Patent
Hajimiri et al.

(10) Patent No.: US 12,114,057 B2
(45) Date of Patent: Oct. 8, 2024

(54) ULTRA-THIN PLANAR LENS-LESS CAMERA

(71) Applicant: California Institute of Technology, Pasadena, CA (US)

(72) Inventors: Seyed Ali Hajimiri, La Canada, CA (US); Seyed Mohammadreza Fatemi, Pasadena, CA (US); Aroutin Khachaturian, Glendale, CA (US); Parham Porsandeh Khial, Alhambra, CA (US); Alexander D. White, Carlsbad, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 16/043,039

(22) Filed: Jul. 23, 2018

(65) Prior Publication Data
US 2019/0028623 A1 Jan. 24, 2019

Related U.S. Application Data

(60) Provisional application No. 62/535,375, filed on Jul. 21, 2017.

(51) Int. Cl.
H04N 23/55 (2023.01)
H04N 23/58 (2023.01)

(52) U.S. Cl.
CPC ............. *H04N 23/55* (2023.01); *H04N 23/58* (2023.01); *B81B 2201/042* (2013.01)

(58) Field of Classification Search
CPC . B81B 2201/042; G02B 27/22; H01L 25/167; H04N 13/20; H04N 13/388;
(Continued)

(56) References Cited

U.S. PATENT DOCUMENTS

| 4,585,948 A | 4/1986 | Schneider et al. |
| 4,915,463 A | 4/1990 | Barbee, Jr. |

(Continued)

FOREIGN PATENT DOCUMENTS

| CN | 1949833 A | 4/2007 |
| CN | 101027598 A | 8/2007 |

(Continued)

OTHER PUBLICATIONS

WIPO Application No. PCT/US2018/046529, PCT International Search Report and Written Opinion of the International Searching Authority dated Dec. 4, 2018.

(Continued)

*Primary Examiner* — Chiawei Chen
(74) *Attorney, Agent, or Firm* — Weaver Austin Villeneuve & Sampson LLP

(57) ABSTRACT

A lens-less imaging device, includes, in part, a multitude of pixels each having a light detector and an associated optical element adapted to cause the pixel to be responsive to a different direction of light received from a target. Each pixel has a field of view that overlaps with a field of view of at least a subset of the remaining pixels. The optical element may be a transparent dielectric element, a transparent MEMS component, a transparent microlens, or include one or more metallic walls. The optical element may be a continuous mapping layer formed over the pixels. Each pixel may or may not have a Gaussian distribution response. The lens-less imaging device forms an image of a target in accordance with an optical transfer functions of the pixels as well as responses of the pixels to the light received from the target.

10 Claims, 13 Drawing Sheets
(3 of 13 Drawing Sheet(s) Filed in Color)

(58) Field of Classification Search
CPC ...... H04N 5/2254; H04N 5/2259; H04N 5/30; H04N 5/3415; H04N 23/55; H04N 23/58; H04N 25/41; H05K 1/189

See application file for complete search history.

(56) References Cited

U.S. PATENT DOCUMENTS

| | | | |
|---|---|---|---|
| 5,196,900 A | | 3/1993 | Pettersen |
| 6,483,096 B1* | | 11/2002 | Kunz ................. G01N 21/6428 |
| | | | 250/214 R |
| 6,587,180 B2* | | 7/2003 | Wang ...................... G02F 1/292 |
| | | | 349/202 |
| 7,211,820 B2* | | 5/2007 | Gunapala .......... H01L 27/14649 |
| | | | 257/184 |
| 7,286,221 B2* | | 10/2007 | Caracci ................ G01N 21/253 |
| | | | 356/300 |
| 8,660,312 B2 | | 2/2014 | Cui et al. |
| 8,710,427 B2* | | 4/2014 | Amako ................ G01N 21/553 |
| | | | 250/237 G |
| 9,110,240 B2* | | 8/2015 | Gill ...................... G02B 5/1842 |
| 9,239,455 B2* | | 1/2016 | Brueck ................. G06T 3/4061 |
| 9,377,179 B2 | | 6/2016 | Tukker et al. |
| 9,484,386 B2* | | 11/2016 | Chang .............. H01L 27/14621 |
| 9,837,455 B2* | | 12/2017 | Lin ................... H01L 27/14645 |
| 10,094,661 B2* | | 10/2018 | Hsu .......................... G01S 3/783 |
| 11,326,946 B2* | | 5/2022 | Brueck ................. G01J 3/0218 |
| 2002/0185535 A1 | | 12/2002 | Tsikos et al. |
| 2003/0038933 A1 | | 2/2003 | Shirley et al. |
| 2003/0103037 A1 | | 6/2003 | Rotzoll |
| 2005/0243439 A1* | | 11/2005 | Tomita .................... G02B 3/005 |
| | | | 359/726 |
| 2007/0083289 A1 | | 4/2007 | Russell |
| 2011/0157393 A1 | | 6/2011 | Zomet et al. |
| 2011/0228142 A1 | | 9/2011 | Brueckner et al. |
| 2012/0013749 A1 | | 1/2012 | Oberdoerster et al. |
| 2012/0091372 A1 | | 4/2012 | Molnar et al. |
| 2012/0286147 A1 | | 11/2012 | Hvass et al. |
| 2013/0085398 A1* | | 4/2013 | Roukes ................ A61B 5/4064 |
| | | | 600/478 |
| 2013/0135515 A1* | | 5/2013 | Abolfadl ................ H04N 5/225 |
| | | | 348/340 |
| 2014/0043320 A1 | | 2/2014 | Tosaya et al. |
| 2014/0085265 A1 | | 3/2014 | Yin |
| 2014/0209581 A1 | | 7/2014 | Pawlowski et al. |
| 2015/0077618 A1* | | 3/2015 | Ueno .................. G02B 13/0035 |
| | | | 348/340 |
| 2015/0125943 A1* | | 5/2015 | Molnar ................ H01L 27/1446 |
| | | | 435/288.7 |
| 2015/0193937 A1* | | 7/2015 | Georgiev ................ G06T 7/557 |
| | | | 382/168 |
| 2015/0236066 A1 | | 8/2015 | Tayanaka |
| 2016/0069997 A1 | | 3/2016 | Johnson et al. |
| 2016/0127713 A1 | | 5/2016 | Hazeghi |
| 2016/0161731 A1 | | 6/2016 | Brueck et al. |
| 2016/0295087 A1 | | 10/2016 | Oberdörster |
| 2017/0112376 A1* | | 4/2017 | Gill .......................... H04N 5/33 |
| 2017/0160482 A1* | | 6/2017 | Frankel ................ G02B 6/4214 |
| 2017/0187933 A1 | | 6/2017 | Duparre |
| 2017/0243373 A1* | | 8/2017 | Bevensee ............... G03B 35/10 |
| 2017/0261738 A1* | | 9/2017 | Shiono ............... G02B 21/0056 |
| 2018/0191953 A1* | | 7/2018 | Stork ................. H01L 27/14625 |
| 2018/0275350 A1* | | 9/2018 | Oh ...................... G02B 6/29316 |
| 2018/0321390 A1 | | 11/2018 | Gotthold et al. |
| 2018/0329185 A1* | | 11/2018 | Gill ...................... G03H 1/0465 |
| 2019/0075282 A1 | | 3/2019 | White et al. |
| 2019/0094575 A1 | | 3/2019 | Wang et al. |
| 2019/0209102 A1* | | 7/2019 | Hugg ....................... G01T 1/166 |
| 2019/0278006 A1* | | 9/2019 | Tajima ................... G02B 13/00 |
| 2020/0124474 A1* | | 4/2020 | Brueck ................. G01J 3/0262 |

FOREIGN PATENT DOCUMENTS

| | | |
|---|---|---|
| CN | 101455071 A | 6/2009 |
| CN | 101622716 A | 1/2010 |
| CN | 102265124 A | 11/2011 |
| CN | 102710902 A | 10/2012 |
| CN | 103837937 A | 6/2014 |
| CN | 104375270 A | 2/2015 |
| CN | 104395818 A | 3/2015 |
| CN | 104518835 A | 4/2015 |
| WO | WO 2012/044250 A1 | 4/2012 |
| WO | WO-2016199984 A1 | 12/2016 |
| WO | WO-2017095587 A1 | 6/2017 |

OTHER PUBLICATIONS

U.S. Appl. No. 16/102,484, Non-Final Office Action dated Mar. 7, 2019.
U.S. Appl. No. 16/102,484, Final Office Action dated Nov. 13, 2019.
WIPO Application No. PCT/US2018/043326, PCT International Preliminary Report on Patentability dated Jan. 30, 2020.
WIPO Application No. PCT/US2018/046529, PCT International Preliminary Report on Patentability dated Feb. 20, 2020.
WIPO Application No. PCT/US2018/043326, PCT International Search Report and Written Opinion of the International Searching Authority dated Sep. 28, 2018.
U.S. Appl. No. 16/102,484, Non-Final Office Action dated Jun. 19, 2020.
U.S. Final Office Action dated Mar. 26, 2021 in U.S. Appl. No. 16/102,484.
U.S. Final Office Action dated May 25, 2022 in U.S. Appl. No. 16/102,484.
U.S. Office Action dated Oct. 29, 2021 in U.S. Appl. No. 16/102,484.
CN Office Action dated Jun. 20, 2022, in Application No. CN201880058687 with English translation.
U.S. Notice of Allowance dated Dec. 23, 2022 in U.S. Appl. No. 16/102,484.
CN Office Action dated Feb. 8, 2023, in Application No. CN201880058687 with English translation.
U.S. Notice of Allowance dated Apr. 12, 2023 in U.S. Appl. No. 16/102,484.
U.S. Notice of Allowance dated Jul. 24, 2023 in U.S. Appl. No. 16/102,484.

* cited by examiner

ULTRA-THIN PLANAR LENS-LESS CAMERA

CROSS REFERENCE TO RELATED APPLICATIONS

The present application claims benefit under 35 USC 119(e) of Application Ser. No. 62/535,375 filed Jul. 21, 2017, the content of which is incorporated herein by reference in its entirety.

FIELD OF THE INVENTION

The present invention relates to imaging devices, and more particularly to a lens-less imaging device.

BACKGROUND OF THE INVENTION

Conventional optical imaging systems use a lens to form an image of a target object on a sensor array. An optical phased array receiver may be used as a coherent imaging device by using a beam-forming technique. Incoherent imaging techniques based on signal correlation have also been used in astronomy

BRIEF SUMMARY OF THE INVENTION

A lens-less imaging device, in accordance with one embodiment of the present invention, includes, in part, a multitude of pixels each having a light detector and an associated optical element adapted to cause the pixel to be responsive to a different direction of light received from a target. Each pixel has a field of view that overlaps with a field of view of at least a subset of the remaining pixels.

In one embodiment, each optical element is a transparent dielectric element having a different angle relative to a reference angle. In one embodiment, each optical element is a transparent MEMS component having a different angle relative to a reference angle. In one embodiment, each optical element is a transparent microlens having a different angle relative to a reference angle. In one embodiment, each optical element has one or more metallic walls having a different angle relative to a reference angle.

In one embodiment, each of a first subset of the pixels has a Gaussian distribution response. In one embodiment, each of a first subset of the pixels has a non-Gaussian distribution response. In one embodiment, the multitude of optical elements form a continuous mapping layer. In one embodiment, the pixels form a one-dimensional array. In one embodiment, the pixels form a two-dimensional array. In one embodiment, the pixels form a three-dimensional array. In one embodiment, the lens-less imaging device forms an image of a target in accordance with an optical transfer functions of the pixels as well as responses of the pixels to a light received from the target.

A lens-less imaging device, in accordance with one embodiment of the present invention, includes, in part, a multitude of grating couplers each adapted to be responsive to a different direction of light received from a target.

A method of forming an image of a target, in accordance with one embodiment of the present invention, includes, in part, receiving a response from each of a multitude of pixels, and forming the image in accordance with the received responses and further in accordance with optical transfer functions of the pixels. Each pixel is responsive to the light received from a different direction from the target and each pixel has a field of view that overlaps with a field of view of one or more of the other pixels.

In one embodiment, each pixel includes a light detector and an associated optical element. In one embodiment, each optical element is a transparent dielectric element having a different angle relative to a reference angle. In one embodiment, each optical element is a transparent MEMS component having a different angle relative to a reference angle. In one embodiment, each optical element is a transparent microlens having a different angle relative to a reference angle. In one embodiment, each optical element has one or more metallic walls having a different angle relative to a reference angle.

In one embodiment, each of a first subset of the pixels has a Gaussian distribution response. In one embodiment, each of a first subset of the pixels has a non-Gaussian distribution response. In one embodiment, the multitude of optical elements form a continuous mapping layer. In one embodiment, the pixels form a one-dimensional array. In one embodiment, the pixels form a two-dimensional array. In one embodiment, the pixels form a three-dimensional array.

A method of forming an image of a target, in accordance with one embodiment of the present invention, includes, in part, receiving a response from each of a multitude of grating couplers, and forming the image in accordance with the received responses and further in accordance with optical transfer functions of the multitude of grating couplers. Each grating coupler is responsive to a different direction of light received from the target. Each grating coupler has a field of view that overlaps with a field of view of one or more of the other grating couplers.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

DETAILED DESCRIPTION OF THE INVENTION

A lens-less imaging device, in accordance with one embodiment of the present invention, includes a directionally sensitive receiver array formed by a multitude of receiver elements that have different responses to different directions from which light from a target is received.

A lens-less imaging device, in accordance with embodiments of the present invention, provides a number of advantages. A lens-less imaging device, accordance with embodiments of the present invention, may be as small as a few wavelengths in thickness; therefore it is thin and compact.

Unlike conventional cameras that require a bulky lens to collect light efficiently, a lens-less imaging device, in accordance with embodiments of the present invention, does not require any external optical components, such as a lens.

Figure 1:
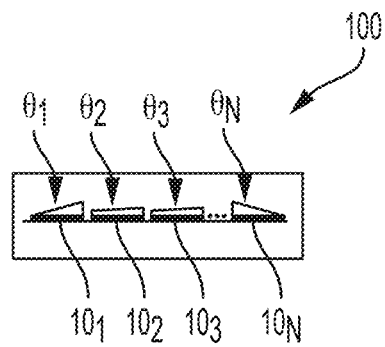
FIG. 1 is a simplified high-level side view of a lens-less imaging device, in accordance with one embodiment of the present invention.

FIG. 1 is a simplified high-level side view of an incoherent/coherent lens-less imaging device 100, in accordance with one embodiment of the present invention. Imaging device 100 is shown as including N directionally sensitive optical receivers (alternatively referred to herein as pixels or detectors) $10_1$, $10_2$, $10_3$ . . . $10_N$ that are shown as being respectively sensitive to light received from directions $\theta_1$, $\theta_2$ . . . $\theta_N$. Imaging device 100 operates as described below.

In an incoherent/coherent imaging system, the phasor amplitudes received from different points on a target are uncorrelated since the illumination is spatially incoherent. Equation (1) below shows the relationship between the light intensity of an image of a target and the light intensity emanating from target along the x-direction for a one-dimensional array of pixels:

$$I_{IM}(f_x) = |H(f_x)|^2 I_{TAR}(f_x) = H(f_x) I_{TAR}(f_x) \quad (1)$$

In equation (1), $I_{IM}(f_x)$ represents the image light intensity shown as being a function of the Fourier transform of the received light intensity along the x-direction, $H(f_x)$ is the optical transfer function providing a mapping between the target and its image, $|H(f_x)|^2$ represents that square of the absolute value of $H(f_x)$, and $I_{TAR}(f_x)$ represents the target light intensity shown as being a function of the Fourier transform of the light intensity emanating from the target along the x-direction.

In a two-dimensional space, the optical transfer function may be represented by the following expression:

$$H(f_x, f_y) = \frac{FT\{h^2(u, v)\}}{\int\int_\infty^{-\infty} |h(u, v)|^2 du dv} \quad (2)$$

In equation (2), h(u, v) represents the point-spread function associated with the imaging system, FT represents the Fourier transform operation, and (u, v) are variables representing positions along the x-y axis.

Using Parseval's identity, it is seen that:

$$H(f_x, f_y) = \frac{\int\int_\infty^{-\infty} H\left(p + \frac{f_x}{2}, q + \frac{f_y}{2}\right) H^*\left(p - \frac{f_x}{2}, q - \frac{f_y}{2}\right) dp dq}{\int\int_\infty^{-\infty} |H(p, q)|^2 dp dq} \quad (3)$$

In equation (3), p and q are variables used in the integration. Accordingly, the optical transfer function $H(f_x, f_y)$ is the normalized autocorrelation function of the amplitude transfer function (ATF). Geometrically, the optical transfer function is the overlap area of the ATF with a spatially shifted version of the ATF divided by the total area of the ATF.

Figure 2:
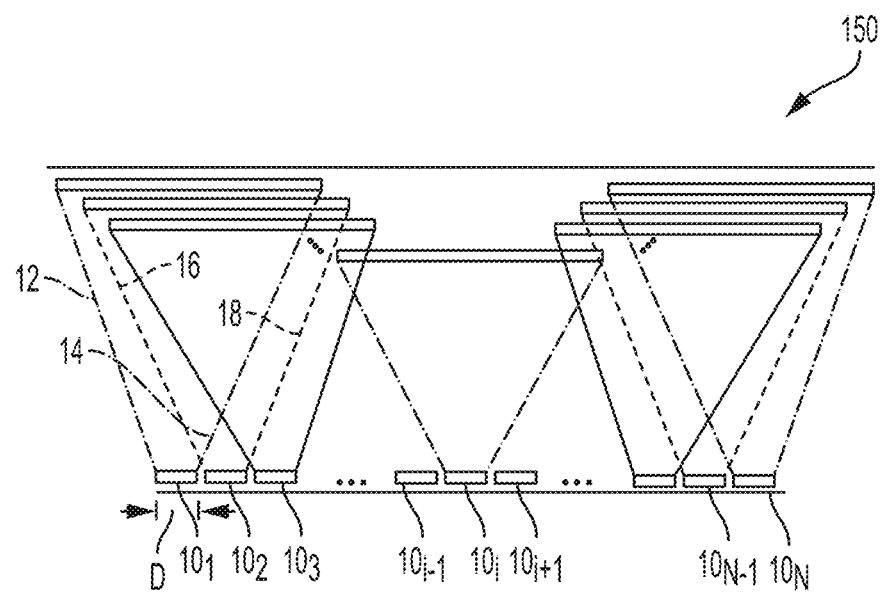
FIG. 2 is a simplified high-level side view of a lens-less imaging device, in accordance with one embodiment of the present invention, in accordance with one embodiment of the present invention.

FIG. 2 is a simplified high-level side view of an incoherent lens-less imaging device 150, in accordance with one embodiment of the present invention, that includes N pixels $10_1$ . . . $10_N$. Also shown in FIG. 2 are the fields of views of pixels $10_1$ . . . $10_N$ each defined by the pixel's optical transfer function H. Each such pixel $10_i$, where i is an index ranging from 1 to N, has a field of view and a transfer function, that overlaps with a transfer function of a multitude of neighboring pixels $10_{i-m}$ . . . $10_{i-1}$, $10_{i+1}$, $10_{i+m}$ as is also seen in the overlapping fields of views shown in FIG. 2, where m is an integer. For example, the field of view of pixel $10_1$ is shown as disposed between lines 12, 14, and the field of view of pixel $10_2$ is shown as disposed between lines 16, 18. For a pixel with a width of D, the effective angular receiving area has the following diffraction limit:

$$d\theta = \frac{1.22\lambda}{D}$$

In accordance with one embodiments of the present invention, because each pixel 10 is sensitive to the light received from a different direction, each pixel captures the incident light differently. The intensity of the light arriving at the angle θ near the center of pixel $10_i$, namely $I_{im_i}(\theta)$, may be defined as shown below:

$$I_{im_i}(\theta)=H_i(\theta)*I_{tar}(\theta)=\int H_i(\theta)I_{tar}(\theta)d\theta \quad (4)$$

In equation (4), $H_i(\theta)$ represents the optical transfer function of pixel $10_i$, $I_{tar}(\theta)$ represents the intensity of the light received from the target, and * denotes the convolution operation.

Since the imaging device has N pixels, the intensity of the light received by the N pixels may be represented by vector $\vec{I}_{im}(\theta)$ defined as shown below:

$$\vec{I}_{im}(\theta)=\vec{H}_i(\theta)*\vec{I}_{tar} \quad (5)$$

In Equation (5), each entry in vector $\vec{I}_{im}(\theta)$ represents the average light intensity received along the direction θ, $\vec{H}(\theta)$ represents the vector of transfer functions, and $\vec{I}_{tar}(\theta)$ represents the average light intensity emanating from the target along the direction θ.

Each vector in equation (5) may be represented by a matrix. Assuming M represents the discretization of the values in equation (5), vector $\vec{I}_{im}$ may be represented by a 1×N matrix Y, vector $\vec{H}(\theta)$ may be represented by an N×M matrix H, and vector $\vec{I}_{tar}$ may be represented by an 1×M matrix I:

$$I = \begin{pmatrix} I_1 \\ \cdots \\ I_M \end{pmatrix}$$

$$H = \begin{pmatrix} H_{11} & \cdots & H_{1M} \\ \vdots & \ddots & \vdots \\ H_{N1} & \cdots & H_{NM} \end{pmatrix}$$

$$Y = \begin{pmatrix} Y_1 \\ \cdots \\ Y_N \end{pmatrix}$$

Accordingly, equation (5) may be shown in a matrix form as:

$$Y=H\cdot I \quad (6)$$

Referring to equation (6) because the matrix Y is obtained by the imaging device, in accordance with the present invention, and the transfer functions of the pixels represented by matrix H is also known, as described further below, the image of the target represented by matrix I can be computed.

Figure 3A:
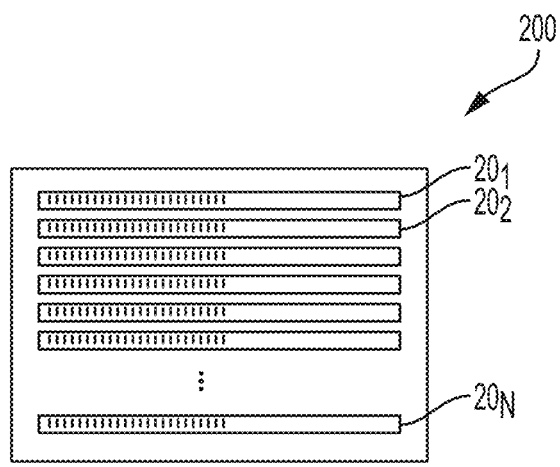
FIG. 3A is a simplified high-level side view of a one-dimensional lens-less imaging device, in accordance with one embodiment of the present invention.

FIG. 3A is a simplified view of a one-dimensional lens-less imaging device 200, in accordance with one embodiment of the present invention. Imaging device 200 is shown as including N grating couplers $20_1$, $20_2$ ... $20_N$ each adapted to have a different response characteristic to the light received from a target whose image is being formed by the imaging device. As shown, for example, in FIG. 3B, grating coupler $20_1$ is shown as being responsive to light arriving at angle $\theta_1$, grating coupler $20_2$ is shown as being responsive to light arriving at angle $\theta_2$, and grating coupler $20_N$ is shown as being responsive to light arriving at angle $\theta_N$.

In one embodiment, by changing the spacing(s) between the openings of a grating coupler, the sensitivity and responsiveness of the grating coupler to the angle of the incident light may be varied. Such angular/directional sensitivity/responsiveness is also referred to herein as angular view.

Figure 3B:
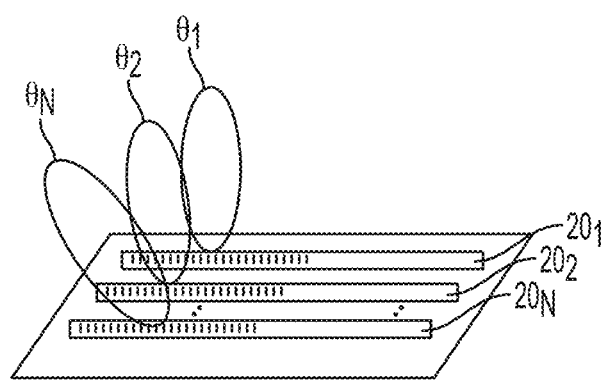
FIG. 3B shows the directional responsiveness of a number of grating couplers of the imaging device shown in FIG. 3A.

Referring to FIGS. 3A and 3B, assume that the incident light has a wavelength of 1550 nm and that each grating coupler (receiving element or pixel) is 0.1 mm long. Because the diffraction limit is nearly dθ=1.1 degrees for each such receiving element, to have a field-of-view (FOV) of, e.g., 120 degrees, nearly 111 receiving elements are needed in such an embodiment to reconstruct an image of the target. Assuming that the receiving elements have a 1 um pitch, the receiving aperture for the imaging device shown in FIGS. 3A and 3B is nearly 1 mm by 1 mm.

Figure 4:
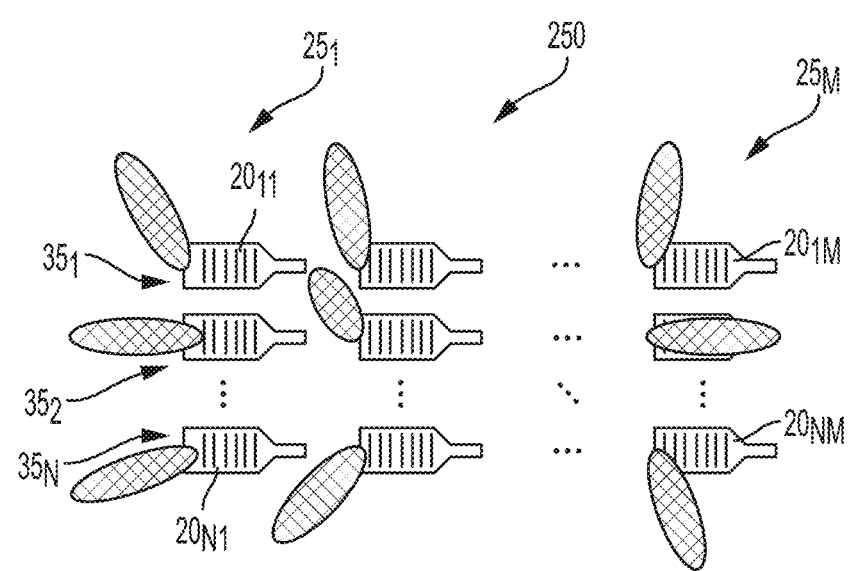
FIG. 4 is a simplified high-level side view of a two-dimensional lens-less imaging device, in accordance with one embodiment of the present invention.

FIG. 4 is a simplified view of a two-dimensional lens-less imaging device 250, in accordance with one embodiment of the present invention. Imaging device 250 is shown as including N×M array of grating couplers. Row $35_1$ is shown as including grating couplers $20_{11}$, $20_{12}$ ... $20_{1M}$. Likewise, row $35_N$ is shown as including grating couplers $20_{N1}$, $20_{N2}$ ... $20_{NM}$. Each grating coupler $20_{ij}$, where i is an index ranging from 1 to N and j is an index ranging from 1 to M, has a different angular view.

In accordance with another embodiment of the present invention, in addition to having different angular views, different pixels or different subsets of the pixels of a lens-less imaging device may have different responses to different wavelengths of the light. Such additional sensitivity to the light wavelength increases the information captured by the imaging device thus enabling it to form a higher resolution of the target image, reflected in the higher rank of the matrix represented by equation 6. In yet other embodiments, by forming pixels that have different responses to different wavelengths, an imaging device, in accordance with embodiments of the present invention, is adapted to form different images of the target for each different wavelength.

Figure 5A:
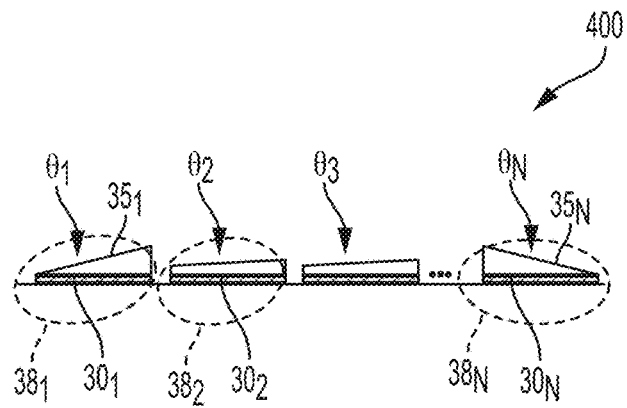
FIG. 5A is a simplified high-level side view of a lens-less imaging device, in accordance with one embodiment of the present invention.

FIG. 5A is a simplified high-level side view of a lens-less imaging device 400, in accordance with one embodiment of the present invention. Imaging device 400 is shown as including N pixels $38_i$ each of which is shown as including a transparent dielectric layer $35_i$ overlaying a light detector $30_i$, where i is an index ranging from 1 to N. As seen from FIG. 5A, the slope of the dielectric layer formed over the light detectors is adapted to vary across the pixel array thereby causing the angular views of the pixels to be different from one another. For example, pixel $30_8$ is shown as having an angular view of $\theta_1$, and pixel $38_N$ is shown as having an angular view of $\theta_N$. Although not shown in FIG. 5A, it is understood that the field of view of each pixel in the array overlaps with the fields of view of multitude of other pixels in the array.

Figure 5B:
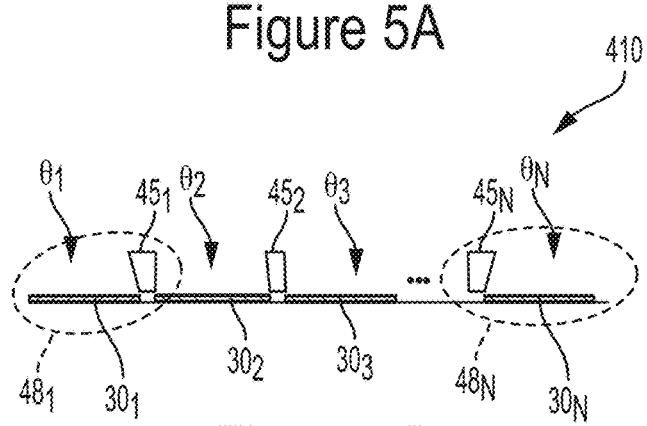
FIG. 5B is a simplified high-level side view of a lens-less imaging device, in accordance with one embodiment of the present invention.

FIG. 5B is a simplified high-level side view of a lens-less imaging device 410, in accordance with another embodiment of the present invention. Imaging device 410 is shown as including N pixels $48_i$ each of which is shown as including a metallic wall $45_i$ facing its associated detector $30_i$, where i is an index ranging from 1 to N. As seen from FIG. 5B, the angle between each detector and its associated wall facing the detector defines the angular view of the pixel. For example, the angle between detector $30_1$ and wall $45_1$ defines the angular view $\theta_1$ of pixel $48_1$. Likewise, the angle between detector $30_N$ and wall $45_N$ defines the angular view $\theta_N$ of pixel $48_N$. Although not shown in FIG. 5B, it is understood that the field of view of each pixel in the array overlaps with the fields of view of multitude of other pixels in the array.

Figure 5C:
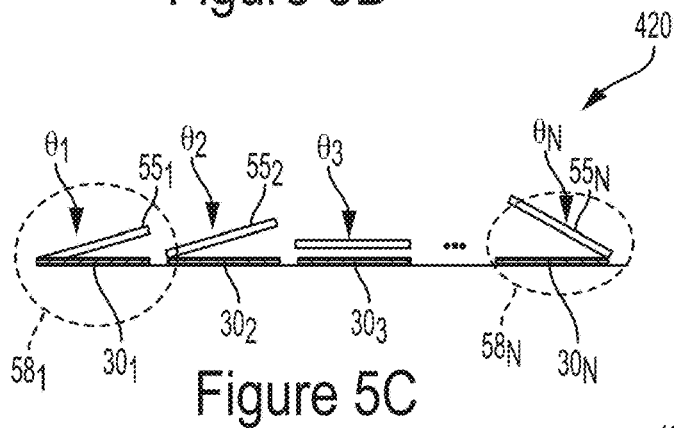
FIG. 5C is a simplified high-level side view of a lens-less imaging device, in accordance with one embodiment of the present invention.

FIG. 5C is a simplified high-level side view of a lens-less imaging device 420, in accordance with another embodiment of the present invention. Imaging device 420 is shown as including N pixels $58_i$ each of which is shown as including a detector $30_1$ and an associated micro electromechanical system (MEMS) component $55_i$, where i is an index ranging from 1 to N. As seen from FIG. 5C, the angle between each detector and its associated MEMS component defines the angular view of the pixel. For example, the angle between detector $30_1$ and its associated MEMS component $55_1$ defines the angular view $\theta_1$ pixel $58_i$. Likewise, the angle between detector $30_N$ and its associated MEMS component $55_N$ defines the angular view $\theta_N$ of pixel $58_N$. By changing the angle of MEMS component $55_i$, the angular view $\theta_i$ of pixel $58_i$ may be varied. It is understood that each MEMS component $55_i$ diffracts the light it receives. Although not shown in FIG. 5C, it is understood that the field of view of each pixel in the array overlaps with the fields of view of multitude of other pixels in the array.

Figure 5D:
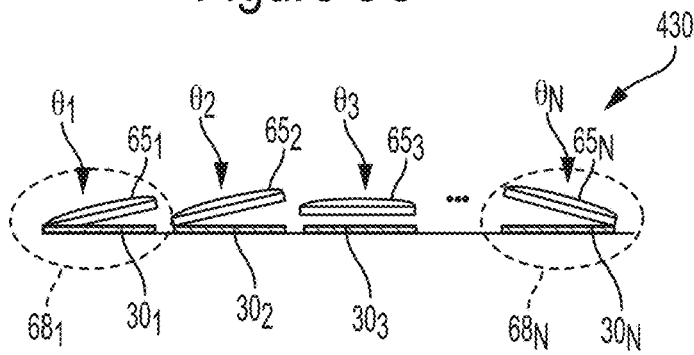
FIG. 5D is a simplified high-level side view of a lens-less imaging device, in accordance with one embodiment of the present invention.

FIG. 5D is a simplified high-level side view of a lens-less imaging device 430, in accordance with another embodiment of the present invention. Imaging device 430 is shown as including N pixels $68_i$ each of which is shown as including a detector $30_i$ and an associated micro lens $65_i$, where i is an index ranging from 1 to N. As seen from FIG. 5D, the angle between each detector and its associated micro lens defines the angular view of the pixel. For example, the angle between detector $30_1$ and its associated micro lens $65_1$ defines the angular view $\theta_1$ of pixel $68_1$. Likewise, the angle between detector $30_N$ and its associated micro lens $55_N$ defines the angular view $\theta_N$ of pixel 68N. By changing the angle of micro lens $55_i$, the angular view $\theta_1$ of pixel $68_i$ may be varied. It is understood that each micro lens $65_i$ diffracts the light it receives. Although not shown in FIG. 5A, it is understood that the field of view of each pixel in the array overlaps with the fields of view of multitude of other pixels in the array. Although not shown, it is understood that the array of pixels shown in any one of the above FIGS. 5A-5D may be stacked so as to form a three-dimensional array to increase the amount of the light being captured and therefore enhance the image construction.

In some embodiments, the light captured by each pixel may have a Gaussian distribution. In some embodiments, the difference between the angular views of each pair of adjacent pixels may be the same. For example, in the embodiment, shown in FIG. 5A, the difference between $\theta_i$ and $\theta_{i+1}$ may be selected to be the same for all i's. For each pixel, the intensity distribution pattern $I_c(\theta)$ may be defined as:

$$I_c(\theta) = \frac{1}{\sigma} e^{-\frac{(\theta-\theta_c)^2}{2\sigma}} \quad (7)$$

where σ represents the beam width and (θ–θc) represents the degree of deviation from the angular view of that pixel. For example, referring to FIG. 5A, pixel $38_i$ is adapted to capture the highest amount of light from the light arriving at $\theta_i$.

In yet other embodiments, the difference between the angular views of different pair of adjacent pixels may be randomly selected and may thus be different. Therefore, in such embodiment, the difference ($\theta_i-\theta_{i+1}$) may be different for different i's.

Figure 6:
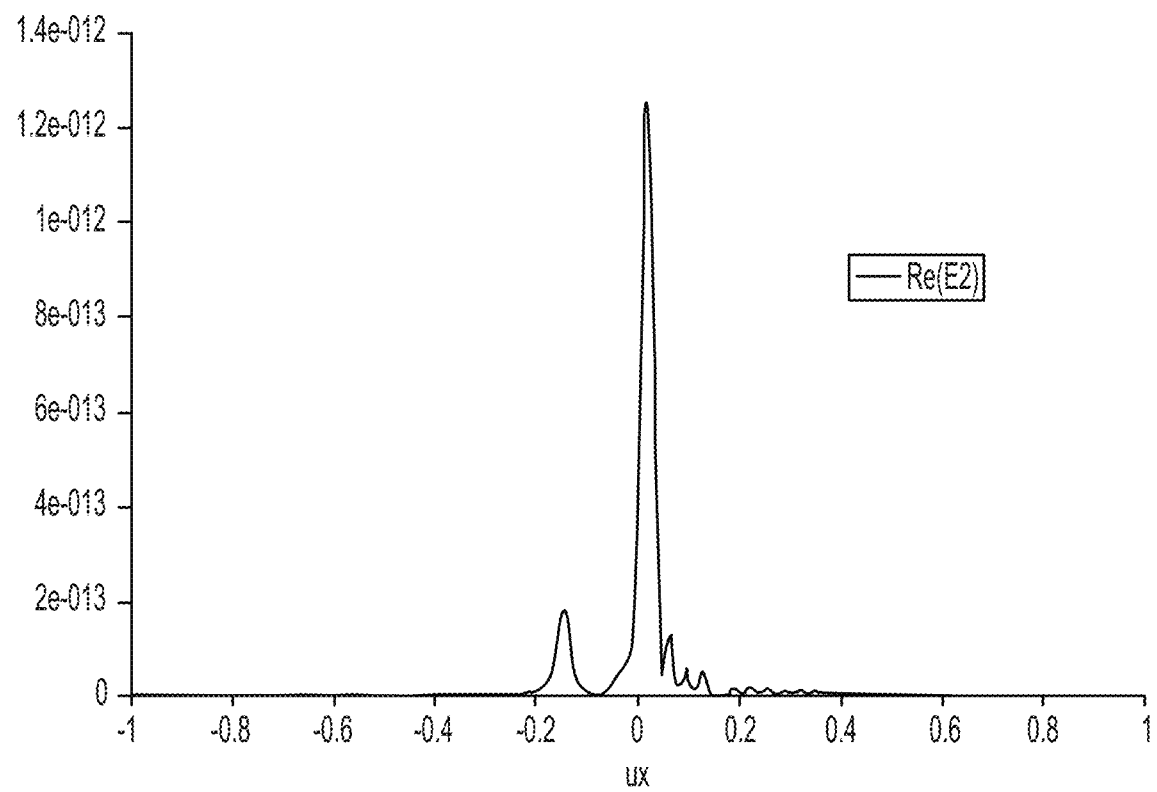
FIG. 6 shows the intensity distribution pattern of the light captured by a grating coupler of FIG. 3A, in accordance with one embodiment of the present invention.

In some embodiments of the present invention, the light captured by the pixels does not have a Gaussian distribution pattern. FIG. 6 shows the intensity distribution pattern of the light captured by a grating coupler, such as the grating couplers $20_i$ shown in FIGS. 3A and 3B. As is seen from FIG. 6, the intensity distribution pattern of the light captured by a grating coupler is not Gaussian.

Figure 7:
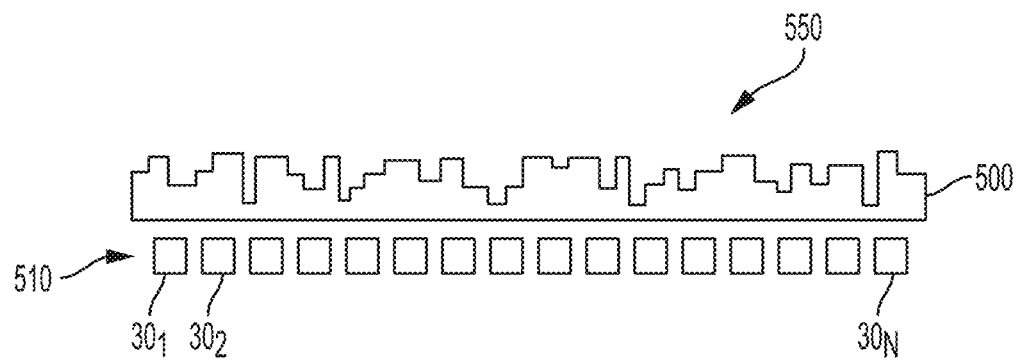
FIG. 7 is a simplified high-level side view of a one-dimensional lens-less imaging device, in accordance with one embodiment of the present invention.
Figures 8A, 8B:
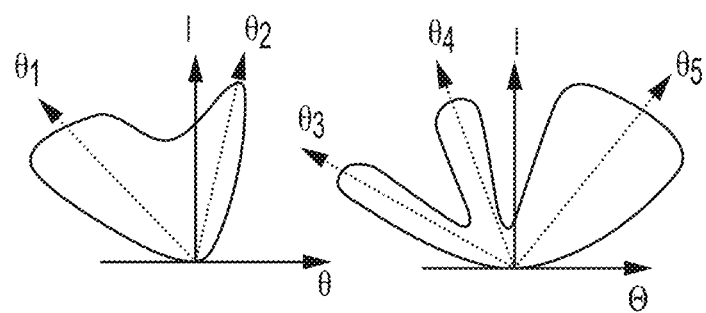
FIGS. 8A and 8B are exemplary response patterns of two of the pixels of the imaging device of FIG. 7, in accordance with one embodiment of the present invention.

In accordance with one embodiment of the present invention, a lens-free imaging device includes a mapping layer formed over an array of detectors. FIG. 7 is a simplified cross-sectional view of a lens-free imaging device 550 shown as including a one-dimensional array 510 of detectors $30_i$ and a mapping layer 500 overlaying detectors $30_i$. Mapping layer 500 is adapted to have a different geometrical shape for different light detectors positioned therebelow. The differing geometrical shapes thus ensure that different detectors have different angular views or response characteristics. FIGS. 8A and 8B are exemplary response patterns of two of the detectors of array 510 caused by differing geometrical shape of the mapping layer 500 overlaying the two detectors. Due to the presence of the overlaying mapping layer, the detector of FIG. 8A shows a maximum sensitivity to the light received from directions $\theta_1$ and $\theta_2$, and the detector of FIG. 8B shows a maximum sensitivity to the light received from directions $\theta_3$, $\theta_4$ and $\theta_5$. By using the transfer function H of the mapping layer 500 associated with each detector together with the light received for each detector, as described above, the image of the target is formed.

Figure 9:
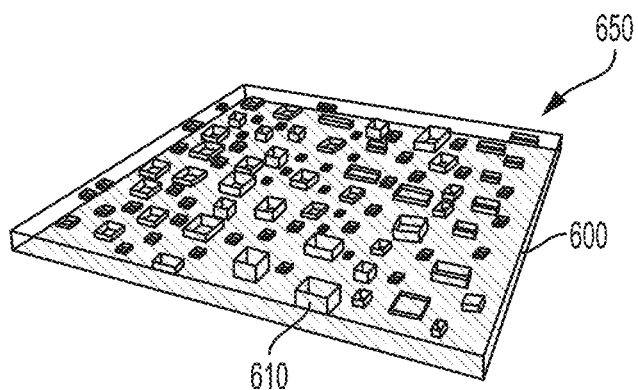
FIG. 9 is a simplified high-level side view of a two-dimensional lens-less imaging device, in accordance with one embodiment of the present invention.

FIG. 9 is a simplified perspective view of a lens-free imaging device 650 shown as including a two-dimensional array 610 of detectors and a mapping layer 600 overlaying the detectors. Mapping layer 600 is adapted to have a different geometrical shape for different light detectors positioned therebelow. The differing geometrical shapes ensure that the different underlaying detectors have different angular response patterns.

Figure 10:
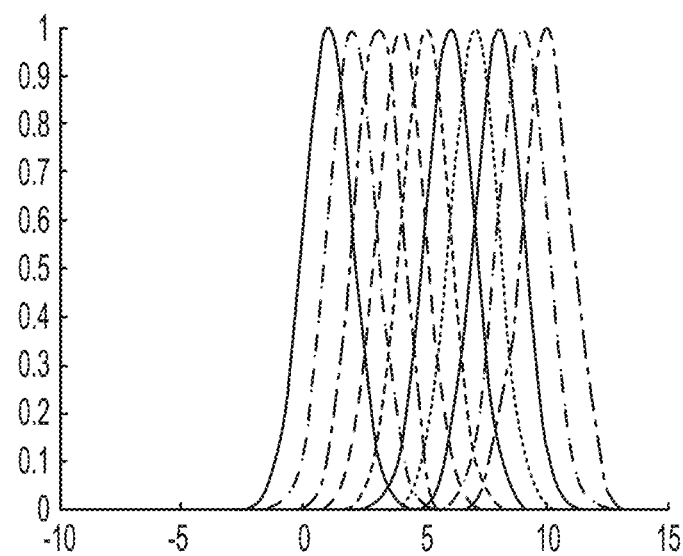
FIG. 10 shows computer simulated intensity distribution pattern of pixels of a one-dimensional array forming a lens-less imaging device, in accordance with one embodiment of the present invention.

FIG. 10 is a computer simulation of the intensity distribution pattern of a one-dimensional receiver array of ten pixels each having a different Gaussian distribution pattern, in accordance with one embodiment of the present invention. As is seen from FIG. 10, each pixel has a different peak and angular view. As is also seen from FIG. 10, many of the distribution patterns overlap, in accordance with embodiment of the present invention.

Figure 11:
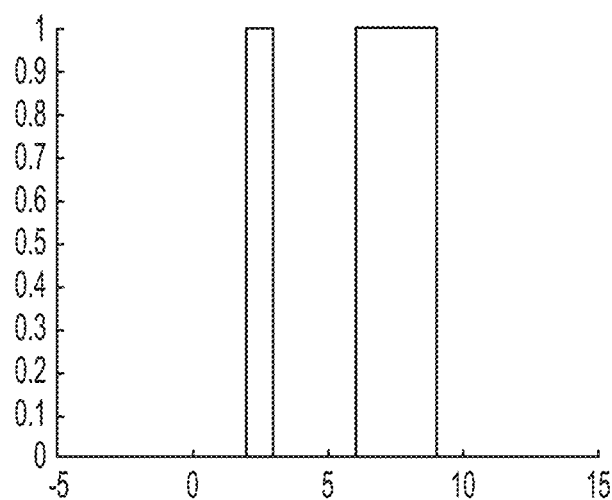
FIG. 11 shows the intensity distribution pattern of a target being imaged, in accordance with embodiments of the present invention.
Figure 12:
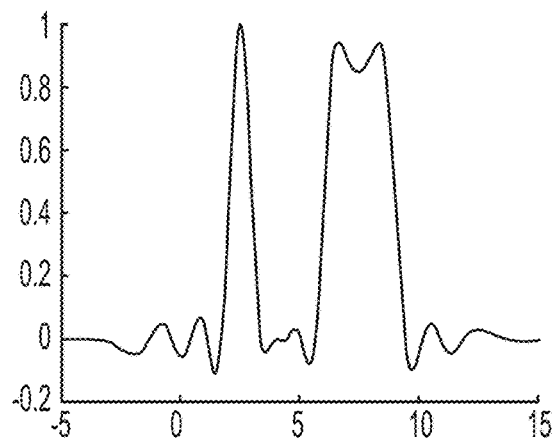
FIG. 12 is a computer simulation of the image of the target of FIG. 11 formed using a lens-less imaging device having a one-dimensional array of pixels, in accordance with one embodiment of the present invention.
Figure 13:
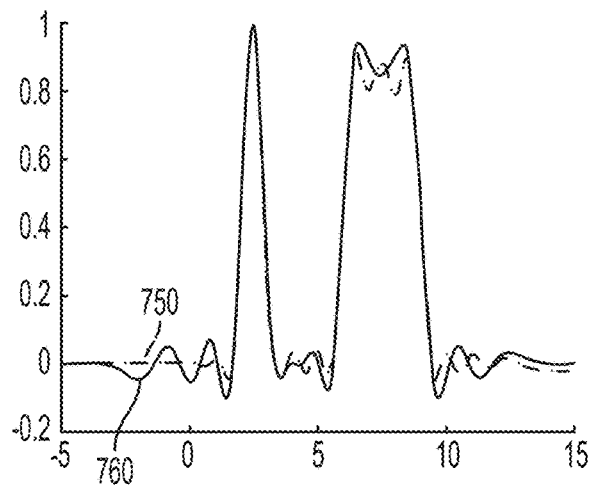
FIG. 13 is a computer simulation of the image of the target of FIG. 11 formed using a lens-less imaging device having a one-dimensional array of pixels, in accordance with one embodiment of the present invention.
Figure 14:
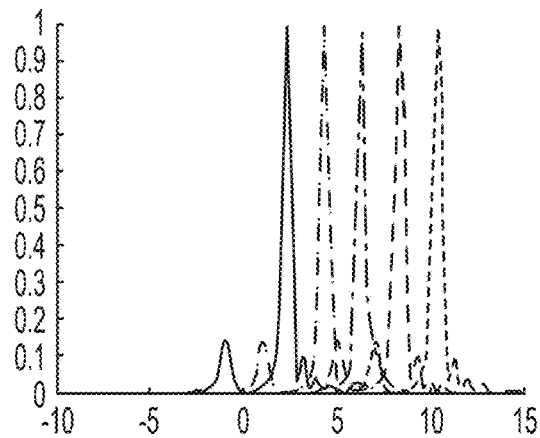
FIG. 14 shows the intensity distribution pattern of the grating coupler shown in FIG. 3A, in accordance with one embodiment of the present invention.

FIG. 11 shows the intensity distribution pattern of a target being imaged, in accordance with embodiments of the present invention. FIG. 12 shows a computer simulation of the image of the target of FIG. 11 constructed using a lens-less imaging device having a one-dimensional array of 20 pixels, in accordance with one embodiment of the present invention. By knowing the optical transfer function of each pixel as well as the response received from each such pixel, the image in FIG. 12 is formed, as described further above. Plot 750 of FIG. 13 shows a computer simulation of the image of the target of FIG. 11 constructed using a lens-less imaging device having a one-dimensional array of 100 pixels, in accordance with one embodiment of the present invention. Plot 760 of FIG. 13 shows the same image as that shown in FIG. 12. FIG. 14 shows the intensity distribution pattern of the grating couplers shown in FIG. 3A, in accordance with one embodiment of the present invention.

Figure 15:
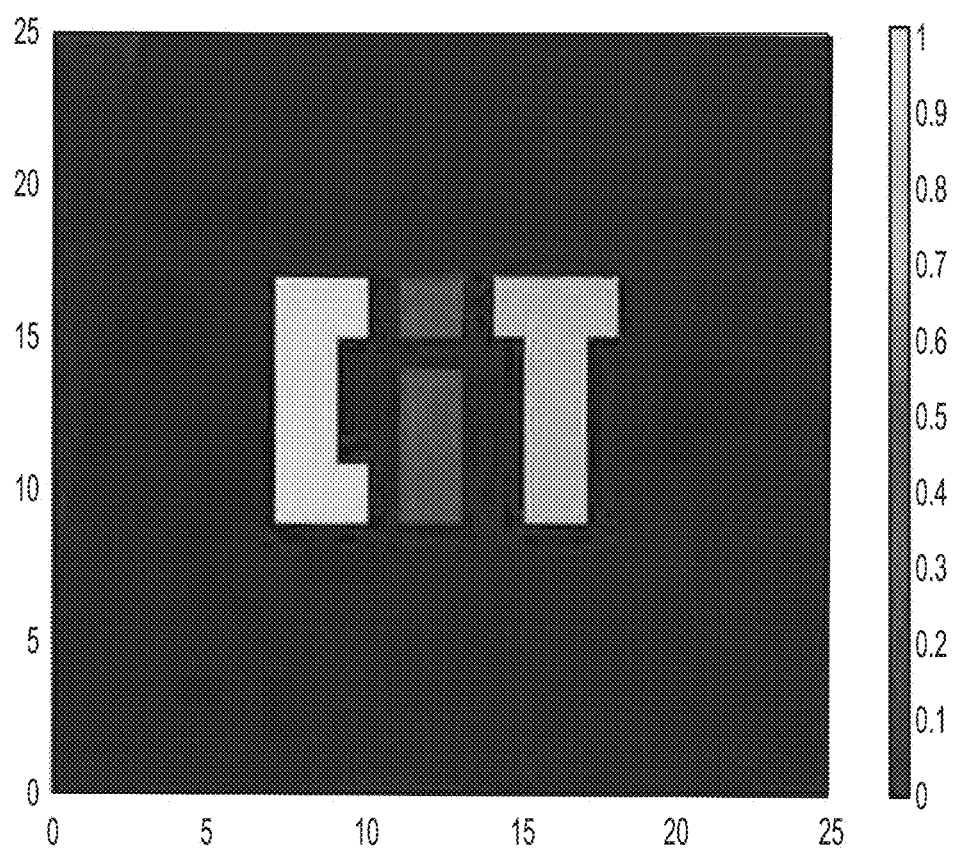
FIG. 15 is a color image of a target being reconstructed using a lens-less imaging device, in accordance with one embodiment of the present invention.
Figure 16:
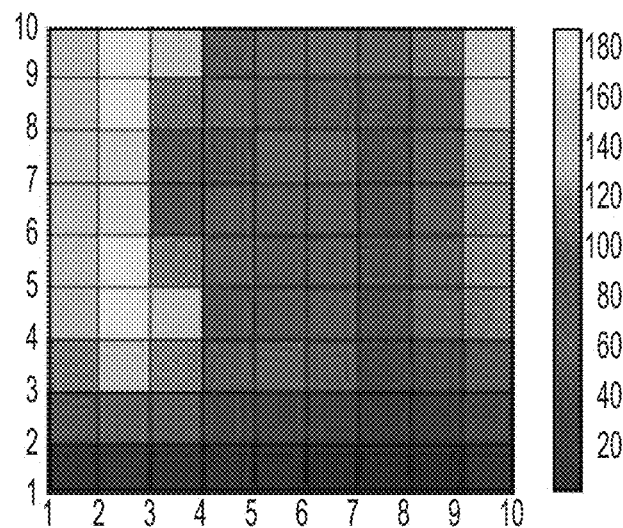
FIG. 16 is the response of an array of pixels of a lens-less imaging device to the target shown in FIG. 15, in accordance with one embodiment of the present invention.
Figure 17:
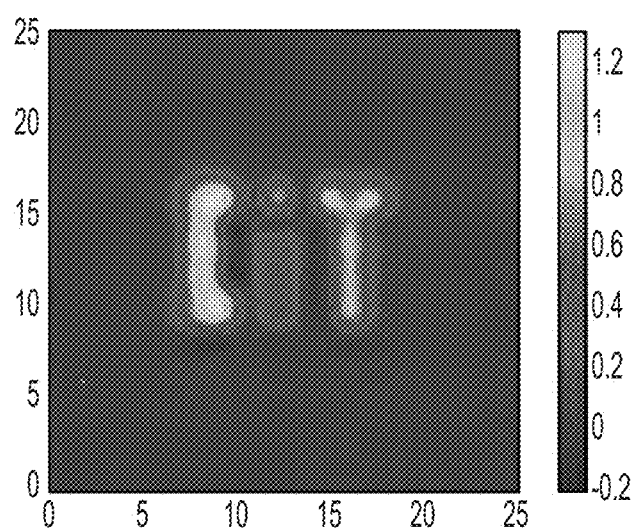
FIG. 17 shows the image of the target shown in FIG. 15 formed using the response shown in FIG. 16.

FIG. 15 is a color image of a target (CiT) being reconstructed using a lens-less imaging device, in accordance with one embodiment of the present invention. FIG. 16 is the response of a 10×10 array of receiving elements (pixels)—each adapted to have a different Gaussian distribution pattern as described above—to the target shown in FIG. 15. FIG. 17 shows the image of the target shown in FIG. 15 formed using the response shown in FIG. 16.

Figure 18:
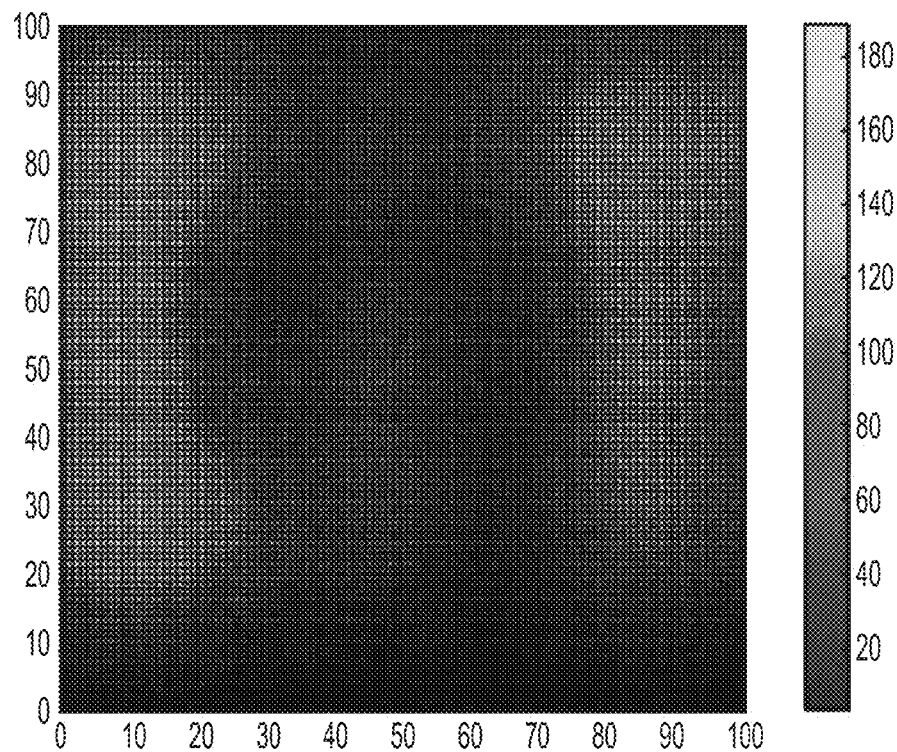
FIG. 18 is the response of an array of pixels of a lens-less imaging device to the target shown in FIG. 15, in accordance with another embodiment of the present invention.
Figure 19:
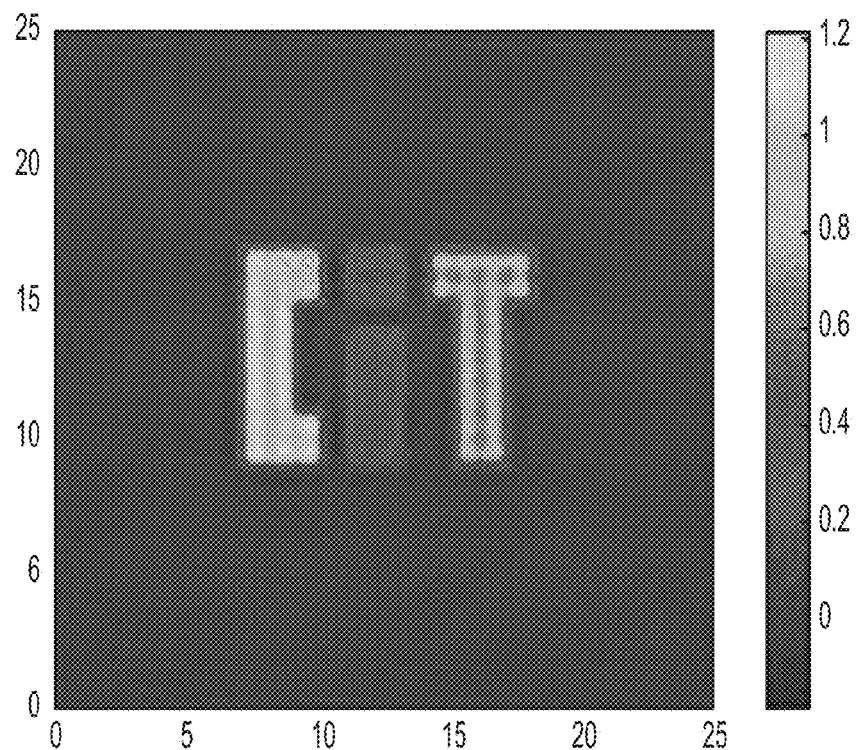
FIG. 19 shows the image of the target shown in FIG. 15 formed using the response shown in FIG. 18.

FIG. 18 is the response of a 100×100 array of pixels—each adapted to have a different Gaussian distribution pattern as described above—to the target shown in FIG. 15. FIG. 19 shows the image of the target shown in FIG. 15 formed using the response shown in FIG. 18.

Figure 20:
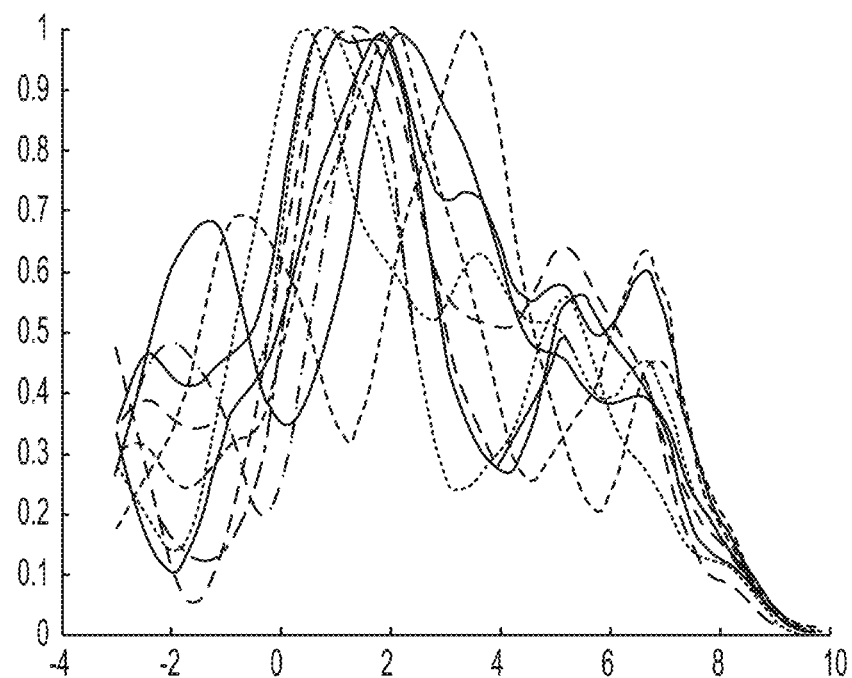
FIG. 20 shows a computer simulation of the intensity distribution pattern of a one-dimensional array of pixels of a lens-less imaging device, in accordance with one embodiment of the present invention.

FIG. 20 shows a computer simulation of the intensity distribution pattern of a one-dimensional receiver array having a multitude of pixels, in accordance with one embodiment of the present invention. As is seen from FIG. 20, each pixel has a non-Gaussian distribution patterns with a different peak and angular view. As is also seen from FIG. 20, many of the distribution patterns overlap, in accordance with embodiment of the present invention.

Figure 21:
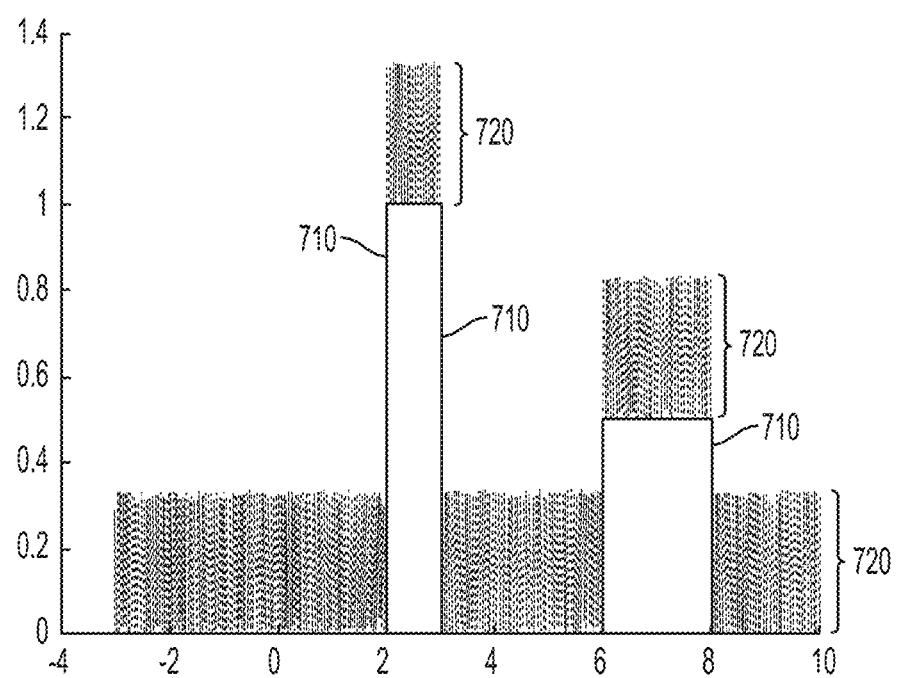
FIG. 21 shows the intensity distribution pattern of a target being imaged, in accordance with embodiments of the present invention.
Figure 22:
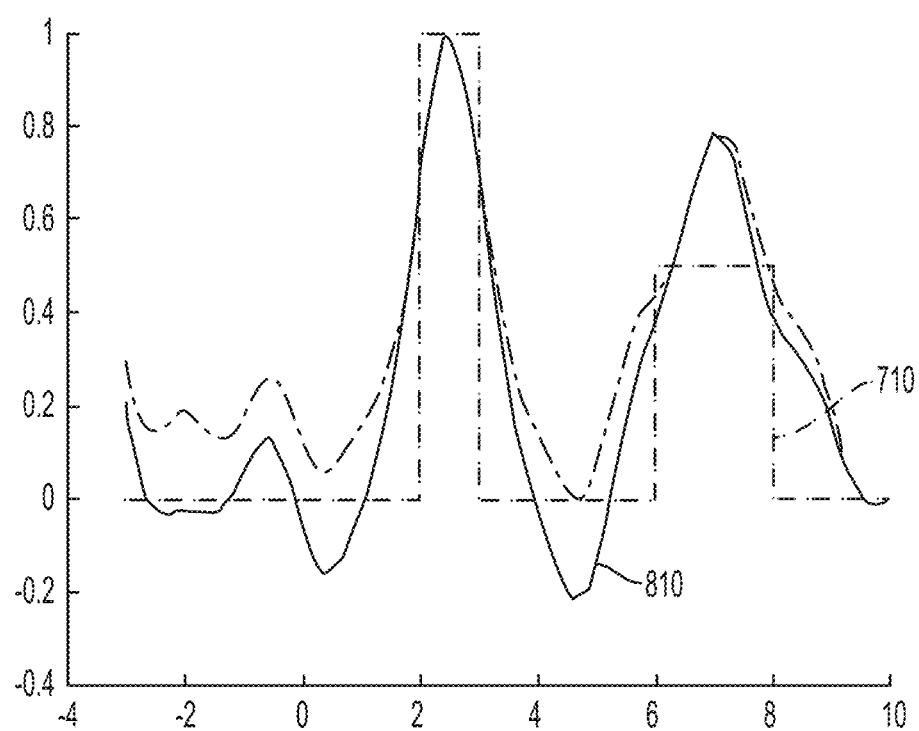
FIG. 22 shows the image of target shown in FIG. 21 as formed by an array of pixels of a lens-less imaging whose intensity distribution patterns are shown in FIG. 20.

FIG. 21 shows the intensity distribution pattern of a target 710 being imaged, in accordance with embodiments of the present invention. Also shown in FIG. 21 is noise 720 injected into the image. Plot 810 of FIG. 22 shows the image of target 710 of FIG. 20 without the injected noise 720. The image represented by plot 810 is formed using the one-dimensional receiver array with receiving elements having a non-Gaussian distribution pattern, as shown in FIG. 20. Plot 820 of FIG. 22 shows the image of target 710 of FIG. 20 with the injected noise 720. The image represented by plot 820 is formed using the one-dimensional receiver array with receiving elements having a non-Gaussian distribution pattern, as shown in FIG. 20. Also shown in FIG. 22 is image 710 of FIG. 21.

The above embodiments of the present invention are illustrative and not limitative. The embodiments of the present invention are not limited by the number of receiving elements or pixels in the array or the number of array dimensions. The above embodiments of the present invention are not limited by the wavelength or frequency of the light. Other modifications and variations will be apparent to those skilled in the art and are intended to fall within the scope of the appended claims.

What is claimed is:

1. A lens-less imaging device comprising:
a plurality of grating couplers, each grating coupler adapted to be responsive to a different direction of light received from a target when the grating coupler is positioned at a same position, wherein a spacing between openings of at least a first one of the plurality of grating couplers is different from a spacing between openings of at least a second one of the plurality of grating couplers, said plurality of grating couplers forming an image of the target in accordance with optical transfer functions of the plurality of grating couplers, the plurality of grating couplers delivering the received light via at least one waveguide.

2. The lens-less imaging device of claim 1 wherein the plurality of grating couplers form a continuous mapping layer.

3. The lens-less imaging device of claim 1 wherein the plurality of grating couplers form a one-dimensional array.

4. The lens-less imaging device of claim 1 wherein the plurality of grating couplers form a two-dimensional array.

5. The lens-less imaging device of claim 1 wherein the plurality of grating couplers form a three-dimensional array.

6. A method of forming an image of a target, the method comprising:
receiving a response from a plurality of grating couplers, each grating coupler being responsive to a different direction of light received from the target when the grating coupler is positioned at a same position, each grating coupler having a field of view that overlaps with a field of view of at least a subset of a remaining ones of the plurality of grating couplers; and
forming the image in accordance with the received responses and further in accordance with optical transfer functions of the plurality of grating couplers, the plurality of grating couplers delivering the received light via at least one waveguide.

7. The method of claim 6 wherein the plurality of grating couplers form a continuous mapping layer.

8. The method of claim 6 wherein the plurality of grating couplers form a one-dimensional array.

9. The method of claim 6 wherein the plurality of grating couplers form a two-dimensional array.

10. The method of claim 6 wherein the plurality of grating couplers form a three-dimensional array.

* * * * *